US008295899B2

(12) United States Patent
Hashizume (10) Patent No.: US 8,295,899 B2
(45) Date of Patent: Oct. 23, 2012

(54) MOBILE WIRELESS DEVICE WITH AN INDUCTIVE COUPLER

(75) Inventor: Takanori Hashizume, Tokyo (JP)

(73) Assignee: Kyocera Corporation, Kyoto (JP)

( * ) Notice: Subject to any disclaimer, the term of this patent is extended or adjusted under 35 U.S.C. 154(b) by 533 days.

(21) Appl. No.: 12/441,845

(22) PCT Filed: Sep. 21, 2007

(86) PCT No.: PCT/JP2007/068436
§ 371 (c)(1),
(2), (4) Date: Sep. 3, 2009

(87) PCT Pub. No.: WO2008/035781
PCT Pub. Date: Mar. 27, 2008

(65) Prior Publication Data
US 2010/0009730 A1    Jan. 14, 2010

(30) Foreign Application Priority Data

Sep. 21, 2006  (JP) ................................ 2006-256311
Jun. 27, 2007  (JP) ................................ 2007-169819

(51) Int. Cl.
*H04M 1/00*    (2006.01)
(52) U.S. Cl. .................... 455/575.7; 455/575.3
(58) Field of Classification Search ............... 455/575.1, 455/575.3, 575.4, 575.7
See application file for complete search history.

(56) References Cited

U.S. PATENT DOCUMENTS

| | | | |
|---|---|---|---|
| 5,554,996 A * | 9/1996 | Chatzipetros | 343/702 |
| 6,613,383 B1 | 9/2003 | George et al. | 455/89 |
| 7,099,632 B2 * | 8/2006 | Hong et al. | 455/90.3 |
| 7,209,084 B2 * | 4/2007 | Lindell | 343/702 |
| 7,225,004 B2 * | 5/2007 | Saito et al. | 455/575.7 |
| 7,352,330 B2 * | 4/2008 | Komine | 343/702 |
| 7,751,860 B2 * | 7/2010 | Symons et al. | 455/575.3 |

(Continued)

FOREIGN PATENT DOCUMENTS

| | | |
|---|---|---|
| EP | 1 693 920 A1 | 8/2006 |
| JP | 07-115380 | 5/1995 |
| JP | 2005-136668 | 5/2005 |

(Continued)

OTHER PUBLICATIONS

Korean language office action (notice of allowance) dated Jan. 17, 2011 and its English language translation for corresponding Korean application 1020097005553 lists the reference above.

*Primary Examiner* — Christopher M Brandt
(74) *Attorney, Agent, or Firm* — DLA Piper LLP (US)

(57) ABSTRACT

A mobile wireless device in which a first housing and a second housing are connected together at base ends thereof via a hinge section, the first housing including a first circuit board to which a first antenna and a second antenna are connected, and the second housing including a second circuit board, includes: an electric wiring section that brings a reference potential section of the first circuit board and a reference potential section of the second circuit board into conduction; and an inductive coupler that inductively couples the reference potential section of the first circuit board and the reference potential section of the second circuit board at high frequency near the second antenna provided at the base end of the first housing, the inductive coupler including a first conductor that extends toward the second housing side at the base end of the first housing and connects to the reference potential section of the first circuit board.

11 Claims, 7 Drawing Sheets

U.S. PATENT DOCUMENTS

| | | | |
|---|---|---|---|
| 7,761,115 B2 * | 7/2010 | Castaneda et al. | 455/562.1 |
| 2006/0030377 A1 * | 2/2006 | White et al. | 455/575.1 |
| 2006/0071863 A1 * | 4/2006 | Lindell | 343/702 |
| 2007/0173301 A1 * | 7/2007 | Kang | 455/575.3 |
| 2008/0039009 A1 * | 2/2008 | Symons et al. | 455/3.06 |
| 2008/0039137 A1 * | 2/2008 | Saegrov | 455/558 |
| 2008/0300028 A1 * | 12/2008 | Uejima et al. | 455/575.3 |

FOREIGN PATENT DOCUMENTS

| | | |
|---|---|---|
| JP | 2005236396 A | 9/2005 |
| JP | 2006-054843 | 2/2006 |
| WO | WO 2004049502 A1 * | 6/2004 |
| WO | WO 2005/053089 A1 | 6/2005 |
| WO | WO 2005050780 A1 * | 6/2005 |

* cited by examiner

MOBILE WIRELESS DEVICE WITH AN INDUCTIVE COUPLER

TECHNICAL FIELD

This application is a national stage of International Application No. PCT/JP2007/068436 filed on Sep. 21, 2007, and claims the benefit of priority under 35 USC 119 of Japanese Patent Application Nos. 2006-256311 filed Sep. 21, 2006, and 2007-169819 filed Jun. 27, 2007, the content of which are incorporated herein by reference.

The present invention relates to a foldable mobile wireless device that incorporates two antennas.

BACKGROUND ART

In a mobile wireless device, a wide band and high gain characteristics must be ensured by stabilizing an antenna current flowing through housings and circuit boards in accordance with the wavelength.

In a foldable mobile wireless device, antenna current flows in a coaxial cable and the like that electrically connects circuit boards provided inside two housings.

Since the coaxial cable and the like passes via a hinge for joining the two housings, it is difficult to ensure a large ground-contact area. This leads to a problem that the coaxial cable and the like functions as a coil at high frequencies. Furthermore, since the antenna current and its return current flow in the coil cable and the like, there is also a problem of reverse-phase cancellation of the antenna current.

To avoid such problems, as disclosed in Patent document 1, conductors connected to a reference potential section (ground) of each circuit board are provided at base ends of two housings (hinge vicinity), and antenna current is flowed through them by capacitance-coupling them at high frequency, thereby avoiding cancellation and the like of antenna current.

[Patent document 1] Japanese Unexamined Patent Application, First Publication No. 2006-54843

DISCLOSURE OF INVENTION

Problem to be Solved by the Invention

Due to design requirements and such like, most mobile wireless devices incorporate the antenna inside a housing. There is also a proliferation of diversity technology that, in a mobile wireless device including a plurality of antennas receiving identical reception signals, gives priority of usage to the signal of an antenna with a superior wave condition, or that changes the weight of a synthesis of reception signals of two antennas (main antennas and sub-antenna).

The distance between the two antennas must be sufficient to avoid deterioration in characteristics due to interference between the antennas. For this reason, in conventional foldable mobile wireless devices, the main antenna is arranged at a front-end side (microphone vicinity) of one housing and the sub-antenna is arranged at a base-end side (hinge vicinity), or the sub-antenna is arranged at a front-end side of one housing and the main antenna is arranged at a base-end side.

However, when conductors connected to respective reference potential sections of each circuit board are provided at base-end sides of the two housings, there is a problem that the sub-antenna and the reference potential sections are in close proximity; for example, the sub-antenna is sometimes surrounded by the conductors, leading to a deterioration in the gain of the sub-antenna.

The present invention has been conceived in view of above problems, and its object is to achieve higher gain in two antennas of a foldable mobile wireless device incorporating the two antennas.

Means for Solving the Problem

To solve the above problems, the mobile wireless device according to the invention employs following means.

A first invention is a mobile wireless device in which a first housing and a second housing are connected together at base ends thereof via a hinge section, the first housing including a first circuit board to which a first antenna and a second antenna are connected, and the second housing including a second circuit board, including: an electric wiring section that brings a reference potential section of the first circuit board and a reference potential section of the second circuit board into conduction; and an inductive coupler that inductively couples the reference potential section of the first circuit board and the reference potential section of the second circuit board at high frequency near the second antenna provided at the base end of the first housing, the inductive coupler including a first conductor that extends toward the second housing side at the base end of the first housing and connects to the reference potential section of the first circuit board.

Moreover, the electric wiring section and the inductive coupler may be arranged at a distance from each other.

Further, the inductive coupler may include a second conductor extending toward the first housing side at the base end of the second housing, being arranged near the first conductor, and connecting to the reference potential section of the second circuit board.

Furthermore, the second conductor may have a sheet-like shape. Moreover, at least one part of the inductive coupler may be formed at a supporting member which supports the hinge section.

Moreover, a connection section between the reference potential section of the first circuit board and the inductive coupler may be formed so as to have inductance.

Further, the connection section may be constituted from a spring member

Furthermore, the spring member may make point-contact between the reference potential section of the first circuit board and the first conductor.

Moreover, the inductive coupler may be arranged so as not to overlap with the second antenna when the first circuit board is seen in plan view.

Further, the first conductor may include a leaf spring section.

EFFECT OF THE INVENTION

The invention obtains the following effects.

Since the invention includes an electric wiring section and an inductive coupler that performs inductive coupling at high frequency, there is almost no cancellation of antenna current flowing between the circuit boards in the two housings. This avoids deterioration in the characteristics of the first antenna, stabilizes its characteristics, and can thus increase its gain. Instead of using capacitance-coupling as in the prior art, the reference potential section of the first circuit board and the reference potential section of the second circuit board are inductively coupled at high frequency, reducing the size of the device.

Further, in the invention, since the inductive coupler includes the first conductor that extends toward the second housing side at the base end of the first housing and connects to the reference potential section of the first circuit board, this first conductor is provided near the second antenna, it functions as an antenna inductor for increasing the gain of the antenna and prevents any deterioration in gain of the second antenna arranged near the inductive coupler. Therefore, it is possible to achieve high gain of both the first antenna and the second antenna.

REFERENCE SYMBOLS

1 Mobile telephone (mobile wireless device)
2 First housing
2a Front end
2b Base end
6 Second housing
6a Front end
6b Base end
10 Hinge section
20 Main circuit board (first circuit board)
21 Main antenna (first antenna)
22 Sub-antenna (second antenna)
24, 24' Hinge-supporting member (supporting member)
24d Conductive portion (inductive coupler, first conductor)
26 Tab (connection section, spring member)
26' Leaf spring section (connection section)
27 Matching circuit
30 Sub-circuit board (second circuit board)
32 Metal plate (inductive coupler, second conductor)
40 Coaxial cable (electric wiring section)
G1, G2 Reference potential patterns (reference potential sections)

BEST MODE FOR CARRYING OUT THE INVENTION

An embodiment of a mobile wireless device according to the invention will be explained with reference to the drawings.

Figure 1:
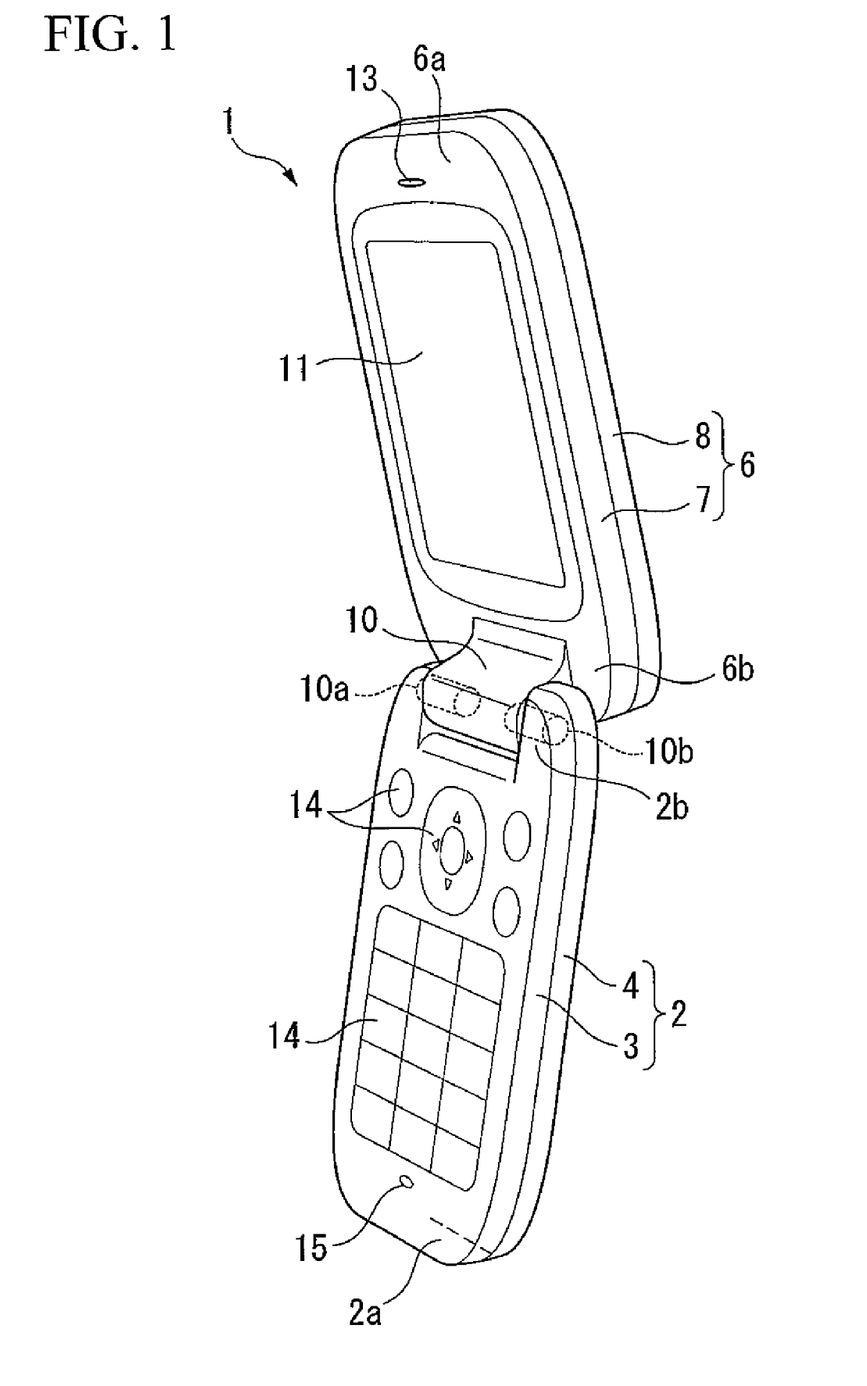
FIG. 1 is an inner-side perspective view of a mobile telephone 1 according to this embodiment.
Figure 2:
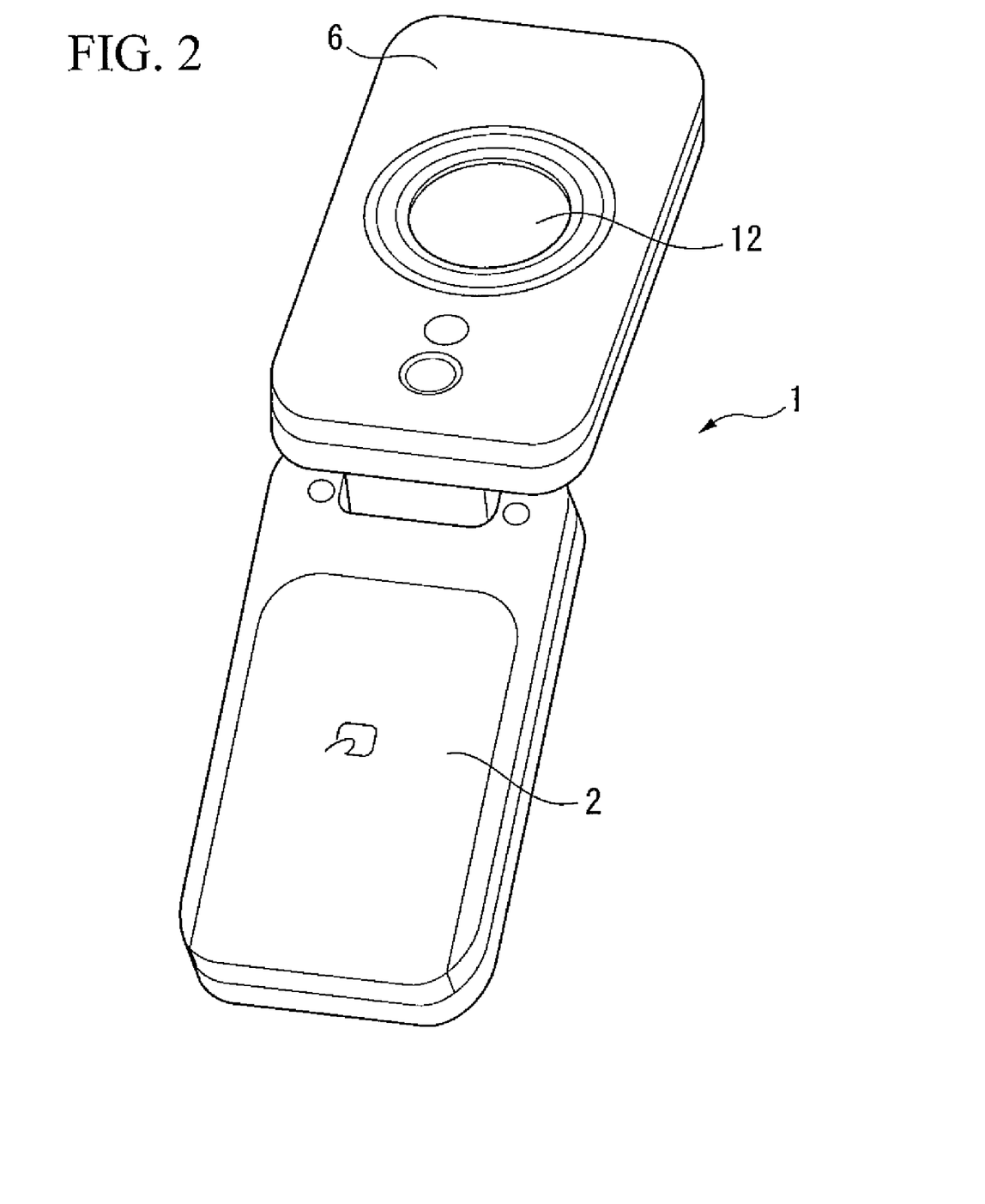
FIG. 2 is an outer-side perspective view of the mobile telephone 1.

FIG. 1 and FIG. 2 are perspective views showing the exterior of a mobile telephone 1 (mobile wireless device) according to this embodiment, FIG. 1 being an inner-side perspective view, and FIG. 2, an outer-side perspective view.

The mobile telephone 1 includes a first housing 2 having a key manipulator 14, a microphone 15, and such like, and a second housing 6 having a main display 11, a speaker 13, and the like.

The first housing 2 includes an inner-side housing 3 and an outer-side housing 4, and internally accommodates a main circuit board 20, and the like. Similarly, the second housing 6 includes an inner-side housing 7 and an outer-side housing 8, and internally accommodates a sub-circuit board 30, and the like.

Respective base ends 2b and 6b of the first housing 2 and the second housing 6 are joined by a hinge section 10, and their respective front ends 2a and 6b move near/further to/from each other as they rotate via the hinge section 10. Thus the mobile telephone 1 can be folded so that the first housing 2 and the second housing 6 overlap.

Figure 3:
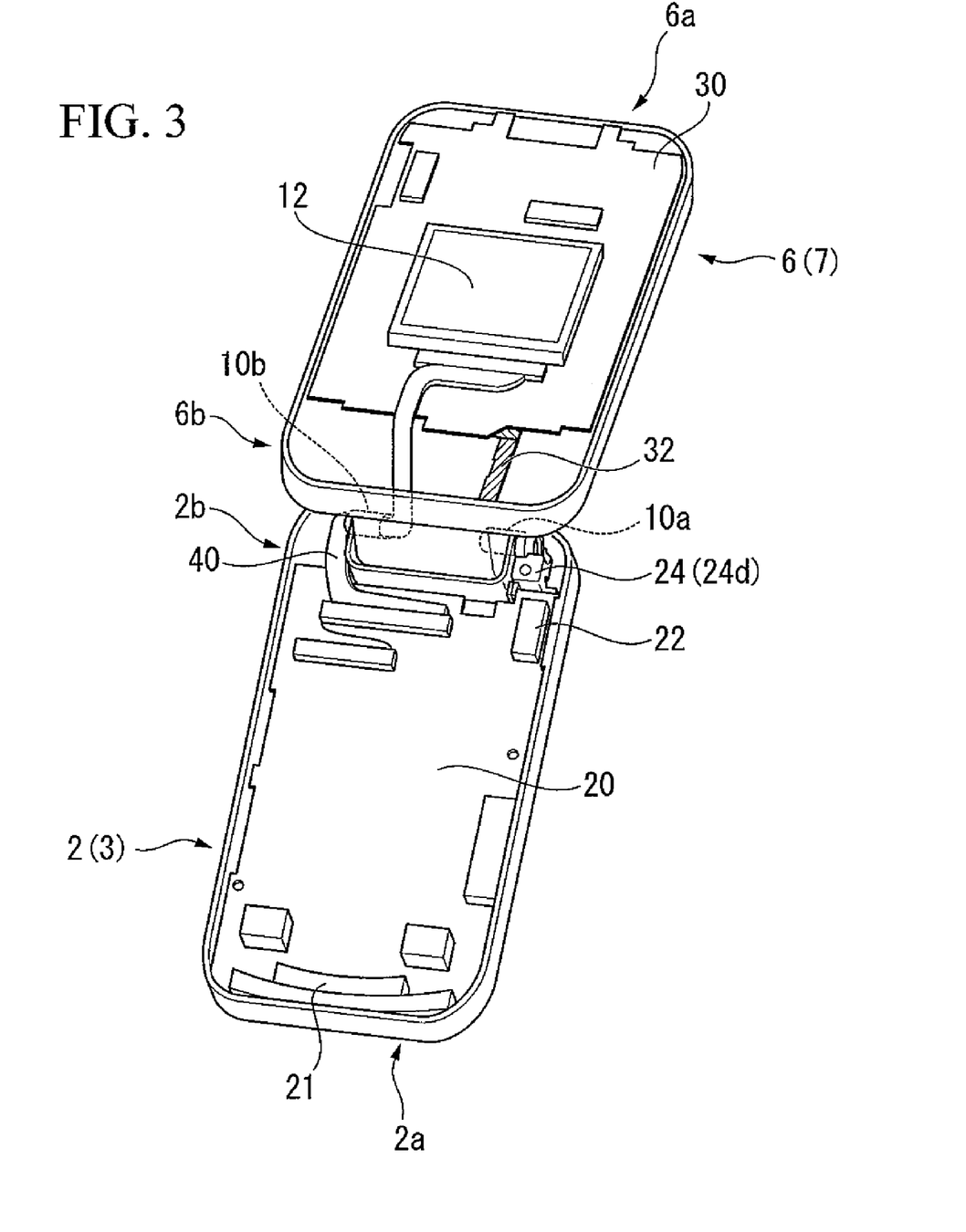
FIG. 3 is an outer-side perspective view showing the internal configuration of the mobile telephone 1.

FIG. 3 is an outer-side perspective view showing the internal configuration of the mobile telephone 1, when the outer-side housing 4 of the first housing 2 and the outer-side housing 8 of the second housing 6 are removed.

Figure 4:
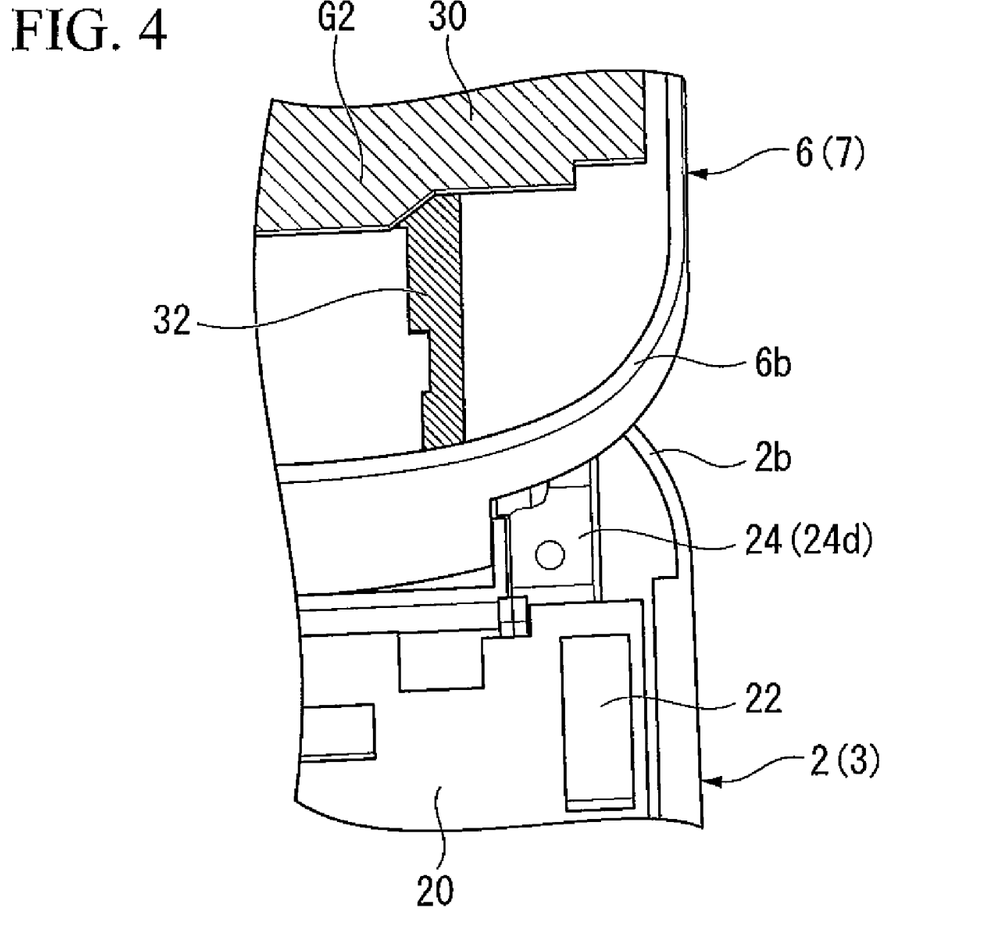
FIG. 4 is a view showing a configuration near a dummy hinge 10a (partially enlarged view of FIG. 3).

FIG. 4 is a partial enlarged view of FIG. 3, and shows the configuration near a dummy hinge 10a.

The main circuit board 20 having a wireless communicator, a controller, and such like is accommodated inside the first housing 2. A main antenna 21 is provided at the front end 2a of the first housing 2, and is electrically connected to the main circuit board 20. Moreover, a sub-antenna 22 mounted on the main circuit board 20 is provided at the base end 2b of the first housing 2. The main antenna 21 and the sub-antenna 22 are arranged at a distance from each other to avoid antenna interference.

Moreover, the sub-antenna 22 is arranged near one corner of the main circuit board 20. This makes it easier to distance the sub-antenna 22 from a reference potential pattern G1 (see FIGS. 6A to 6C) formed in the main circuit board 20. Thus, deterioration in gain of the sub-antenna 22 due to interference can be reliably prevented, and moreover, additional electronic components can be effectively mounted.

The sub-circuit board 30 is accommodated inside the second housing 6. A sub-display 12 is arranged roughly in the center of the sub-circuit board 30.

The main circuit board 20 in the first housing 2 and the sub-circuit board 30 in the second housing 6 are electrically connected by a coaxial cable 40. The coaxial cable 40 is inserted in a dummy hinge 10b of the hinge section 10 described later (see FIG. 1), and both its ends are connected to signal wire patterns and reference potential patterns G1 and G2 of the main circuit board 20 and the sub-circuit board 30 respectively (see FIG. 4, and FIGS. 6A to 6C).

The hinge section 10 includes a hinge 10a with a solid structure and a dummy hinge 10b with a cylindrical structure, and they are arranged at the respective base ends 2b and 6b of the first housing 2 and the second housing 6 (see FIG. 1). Furthermore, the hinge 10a and the dummy hinge 10b are arranged at a distance from each other on both sides of the first housing 2 and the second housing 6 in the short direction thereof.

The internal spaces of the first housing 2 and the second housing 6 are configured to be joined to each other through the dummy hinge 10b. As mentioned above, the coaxial cable 40 is inserted into the dummy hinge 10b, and electrically connects the reference potential patterns G1 and G2 of the main circuit board 20 and the sub-circuit board 30.

A metal plate 32 is provided at the base end 6b in the second housing 6 so as to protrude from the sub-circuit board 30 toward the first housing 2 side (in the long direction of the second housing 6). This metal plate 32 is electrically connected to the reference potential pattern G2 of the sub-circuit board 30.

Similarly, a hinge-supporting member 24 is provided at the base end 2b in the first housing 2 so as to protrude from the main circuit board 20 toward the second housing 6 side (in the long direction of the first housing 2). A conductive portion 24d electrically connected to the reference potential pattern G1 of the main circuit board 20 is formed in the hinge-supporting member 24 (see FIG. 5, and FIGS. 6A to 6C). The hinge-supporting member 24 is arranged at a distance from the coaxial cable 40 in the short direction of the first housing 2.

Since the coaxial cable 40 and the hinge-supporting member 24 are arranged at a distance from each other, it becomes possible to reduce cancellation between antenna current of the main antenna 21 of the coaxial cable 40 and antenna current of the main antenna 21 of the hinge-supporting member 24.

Figure 5:
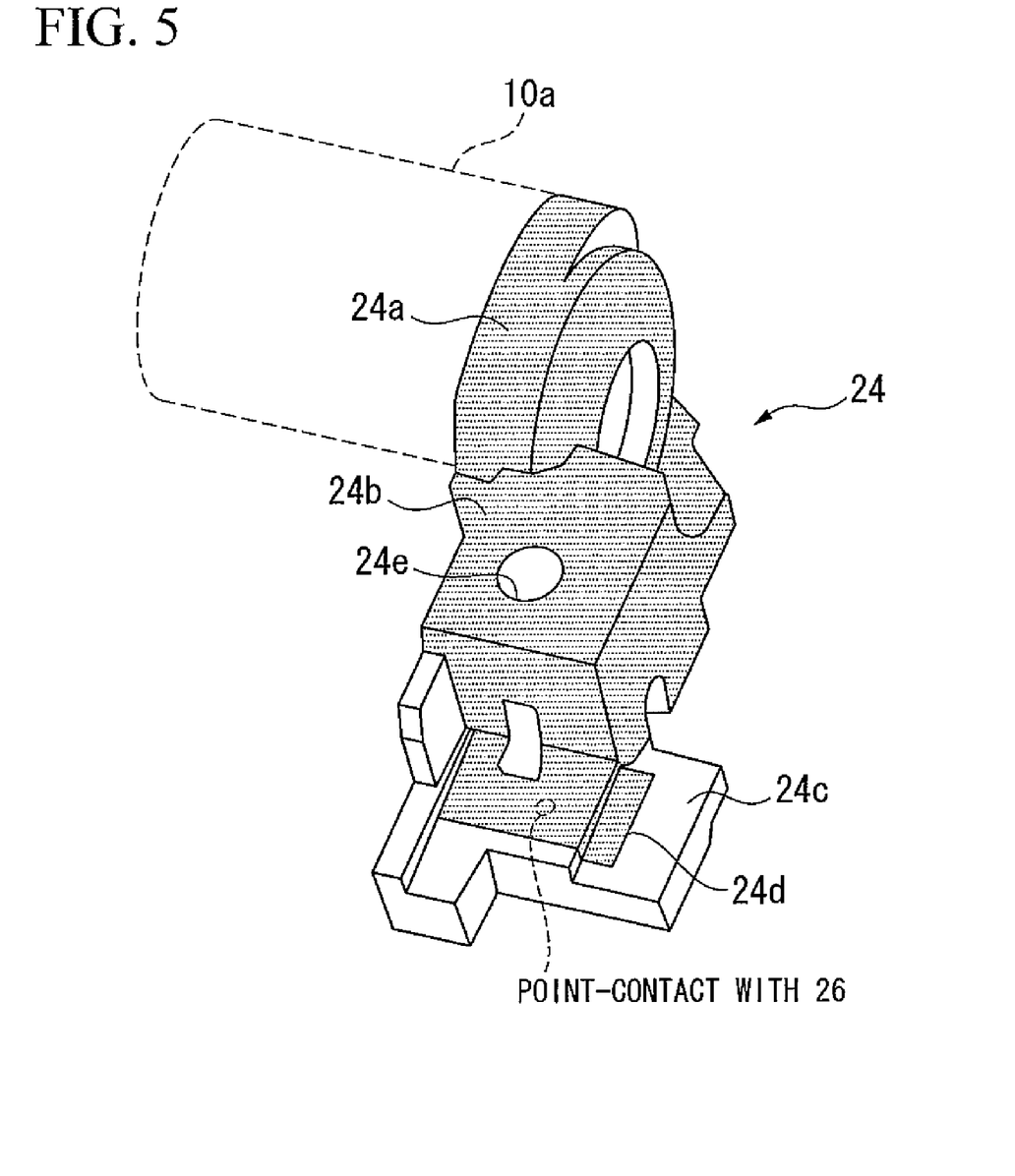
FIG. 5 is a perspective view showing one embodiment of a hinge-supporting member.
Figure 6A:
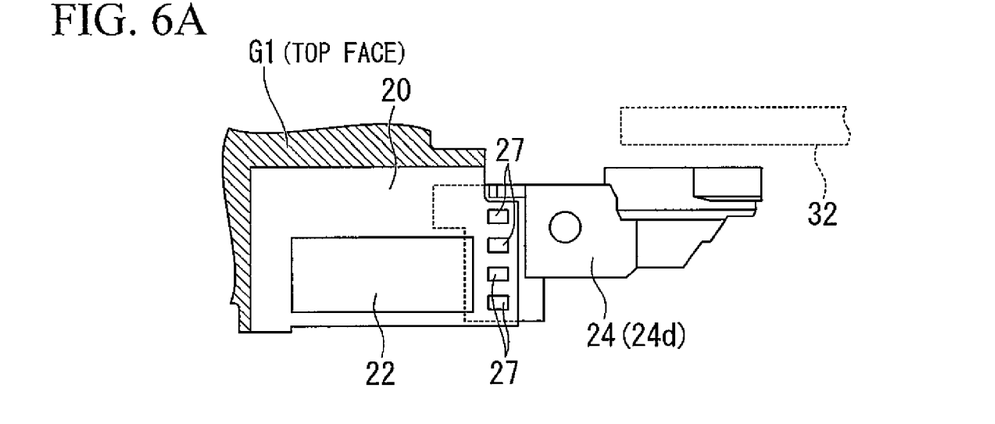
FIG. 6A is a top view showing one embodiment of such as the arrangement of the hinge-supporting member, a main circuit board.
Figure 6B:
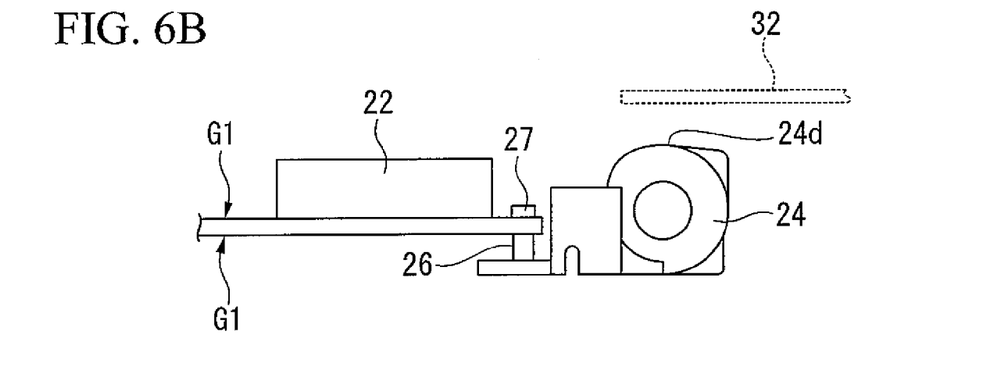
FIG. 6B is a side view showing one embodiment of such as the arrangement of the hinge-supporting member, the main circuit board.
Figure 6C:
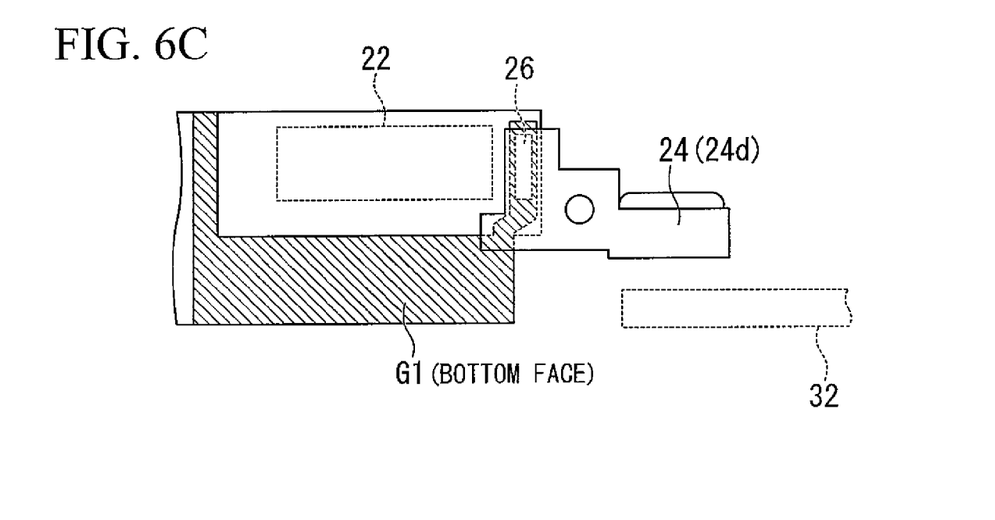
FIG. 6C is a view showing one embodiment of such as the arrangement of the hinge-supporting member, the main circuit board.

FIG. 5 is a perspective view showing the hinge-supporting member 24. FIGS. 6A to 6C show the arrangement of the hinge-supporting member 24 and the main circuit board 20, and the like, FIG. 6A being a top view, FIG. 6B a side view, and FIG. 6C a bottom view.

The hinge-supporting member 24 supports one end of the hinge 10a, and is a plastic member including an approximately cylindrical hinge-supporting portion 24a that is fixed to one end face of the hinge 10a to support it, a securing portion 24b with a screw-hole 24e formed therein for securing it to the first housing 2 (inner side housing 3), and a protruding portion 24c that is arranged so as to overlap with the main circuit board 20. The hinge-supporting member 24 has a conductive portion 24d that is formed by deposition of a conductive material such as to almost entirely cover the top faces of the hinge supporting portion 24a, the securing portion 24b, and the protruding portion 24c (outer side of the mobile telephone 1).

The protruding portion 24c of the hinge-supporting member 24 is arranged such that, when the main circuit board 20 is seen in plan view, the protruding portion 24c overlaps with the bottom-face side of the main circuit board 20 (inner side of the mobile telephone 1). A leaf spring like tab 26 mounted on the bottom face of the main circuit board 20 makes point-contact with the conductive portion 24d on the protruding portion 24c. The tab 26 connects to the reference potential pattern G1 of the main circuit board 20, whereby the conductive portion 24d of the hinge-supporting member 24 is at the same potential as the reference potential pattern G1 of the main circuit board 20.

While the tab 26 is constituted by a spring member, there are no particular limitations on its shape, the only requirement being that it has inductance, as explained below. That is, for example, an inductor such as a conductive member with cushioning properties can be used instead of the tab 26.

Moreover, since the tab 26 is constituted by a spring member that makes point-contact with the conductive portion 24d, even if the positions of the main circuit board 20 and the hinge-supporting member 24 are moved relative to each other, poor connection between the main circuit board 20 and the hinge-supporting member 24 can be reduced.

As already described, the conductive portion 24d formed on the hinge-supporting member 24 in the first housing 2 and the metal plate 32 arranged in the second housing 6 extend in approximately the same direction, and are positioned near each other (see FIGS. 6A to 6C).

Also, since the metal plate 32 has inductance, and the hinge-supporting member 24 acquires inductance from the tab 26, high-frequency coupling of the conductive portion 24d of the hinge-supporting member 24 and the metal plate 32 becomes easy. That is, high-frequency coupling of the conductive portion 24d and the metal plate 32 allows antenna current to flow between the conductive portion 24d and the metal plate 32 (in the air).

Thus, even if antenna current flows from the main circuit board 20 via the coaxial cable 40 toward the second housing 6, its return current (antenna current) will flow from the second housing 6 toward the main circuit board 20 via the metal plate 32 and the hinge-supporting member 24. This almost completely eliminates the problem of cancellation of antenna current caused by the antenna current and the return current flowing in the coaxial cable 40. The radiation of the main antenna 21 is thereby stabilized, achieving regular radiation, and thereby ensuring a high gain.

The connection section between the conductive portion 24d and the reference potential pattern G1 of the main circuit board 20A is given a weak inductance by using the tab 26. Since the connection section between the reference potential pattern G1 of the main circuit board 20 and the conductive portion 24d has inductance, the gain of the main antenna 21 can be increased by coupling the hinge-supporting member 24 and the thin metal plate 32 extending from the sub-circuit board 30.

That is, the connection section between the reference potential pattern G1 of the main circuit board 20 and the conductive portion 24d is given a weak inductance by using the tab 26, and the conductive portion 24d attains a higher inductance than the reference potential pattern G1 of the main circuit board 20, thereby preventing deterioration in the gain of the sub-antenna 22. Moreover, the connection section between the reference potential pattern G1 of the main circuit board 20 and the conductive portion 24d is given a weak inductance by using the tab 26, and the conductive portion 24d does not attain an inductance that is remarkably higher than the reference potential pattern G1 of the main circuit board 20 (high inductance), thereby reducing deterioration in the gain of the main antenna 21.

In particular, since the conductive portion 24d arranged in the first housing 2 is inductively coupled at high frequency to the metal plate 32 arranged in the second housing 6, in comparison with conventional capacitive coupling, the area (ground-contact area) of the conductive portion 24d and the metal plate 32 can be reduced. Therefore, the mobile telephone 1 can be made smaller and thinner.

Moreover, according to this embodiment, the characteristics of the main antenna 21 can be stabilized and the main antenna 21 can achieve high gain, and the sub-antenna 22 is also assisted in achieving high gain.

That is, in this embodiment, the conductive portion 24d is formed on the hinge-supporting member 24, whereby the hinge-supporting member 24 including the conductive portion 24d functions as an inductor (member for increasing the gain of the sub-antenna), and the gain of the sub-antenna 22 is thus increased.

The tab 26 is mounted on the opposite face (inner face) to the face (outer face) where the sub-antenna 22 is mounted. Moreover, one part of the reference potential pattern G1 of the main circuit board 20 connected to the tab 26 is formed at a minimum required line-width. The minimum required line-width is the minimum line-width required for mounting the tab 26. Therefore, the tab 26 and one part of the reference potential pattern G1 connected to it are weak as ground, reducing adverse effects on the sub-antenna 22.

A matching circuit 27 formed by a combination of coils and capacitors for controlling band and gain is connected to the sub-antenna 22, and, as with the sub-antenna 22, the tab 26 and one part of the reference potential pattern G1 connected to it have almost no adverse effect on the matching circuit 27.

That is, since the tab 26 connects to ground, there is a possibility that it might have an effect on the matching circuit 27 mounted on the outer side. More accurately, not the tab 26 itself, but the part of the reference potential pattern G1 where the tab 26 is mounted might have an effect on the matching circuit 27. The effect is one that affects the gain on the sub-antenna 22. However, since one part of the reference potential pattern G1 has an effect-minimizing area and is a weak ground, the matching circuit 27 can also perform matching while taking effects of the reference potential pattern G1 into consideration, whereby its effects are reduced. Moreover, since one part of the reference potential pattern G1 where the tab 26 is mounted is part of a power supply section, and has a small area, its effects on actual radiation are reduced.

As shown in FIGS. 6A to 6C, since the tab 26 has inductance, the matching circuit 27 can be installed on the rear faces of tab 26 and the reference potential pattern G1 connected to it (the top face of the main circuit board 20), and electronic components can be effectively mounted on the mount face of the main circuit board 20.

As shown in FIGS. 6A to 6C, when the main circuit board 20 is seen in plan view (seen from a direction perpendicular to the paper in FIG. 6A), the conductive portion 24d is arranged on the hinge-supporting member 24 so as not to overlap with the sub-antenna 22, thereby reducing deterioration in the gain of the sub-antenna 22 in the plan-view direction (the direction perpendicular to the paper in FIG. 6A).

Figure 7A:
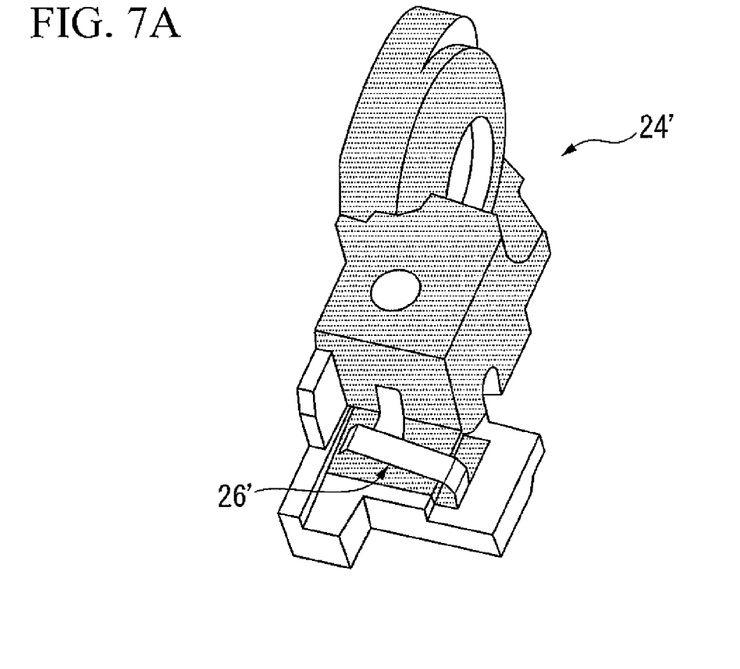
FIG. 7A is a bottom view showing another embodiment of such as the arrangement of a hinge-supporting member, a main circuit board.

Further, as shown in FIG. 7A, a hinge-supporting member 24' can be formed by integral-molding or pasting together a metal plate and a resin. In this case, no spring component is provided on the main circuit board 20 side, and the metal plate is provided with a leaf spring section 26' which is made to contact a thin pattern on the main circuit board 20 side, obtaining electrical continuity with the main circuit board 20.

Figure 7B:
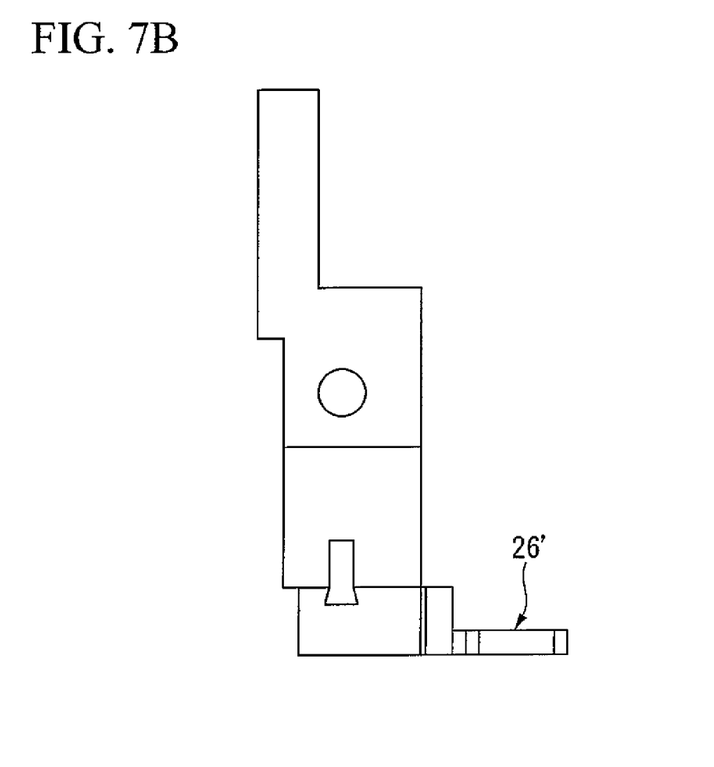
FIG. 7B is an exploded view of a metal plate of FIG. 7A.

FIG. 7B is an exploded view of a metal plate that is joined to a resin by integral molding or pasting.

In this embodiment, the contact of the leaf spring section 26' connects the hinge-supporting member 24' to the ground of the main circuit board 20. A thin pattern is used to achieve conduction between the ground of the main circuit board and the hinge-supporting member 24', and the leaf spring section 26' has inductance, it is made to be a weak ground. This prevents deterioration in the gain of the sub-antenna 22 due to the ground of the main circuit board. Also, since the leaf spring section 26' is made to contact the rear of the board of the matching component of the sub-antenna, compact mounting can be accomplished.

In this embodiment, the spring component mounted on the board makes contact with the hinge-supporting portion, thereby eliminating contact failures due to scratching away of a conductive coating that is applied to the hinge-supporting portion, or a conductive coating such as vapor deposit, and also eliminating the problem of spring components that are mounted on the board being peeled off during a collision such as dropping; thus reliability can be increased. Moreover, there is no need to mount a spring component on the board, enabling the number of components to be reduced and lowering costs.

While present embodiments have been described above, it should be understood that the shapes and combinations of the constituent members shown in the above embodiments are exemplary, and that various modifications based on design requirements and such like can be made without departing from the main points of the invention.

For example, while an example was described where the conductive portion 24d is formed almost entirely over one face of the hinge-supporting member 24 (hinge supporting portion 24a, securing portion 24b, and protruding portion 24c), the configuration is not limited to this. The conductive portion 24d is only required to extend, on the hinge-supporting member 24, from the first housing 2 side toward the second housing 6 side, so as to achieve high-frequency inductive coupling.

Further, while the mobile telephone 1 is described in the above embodiments, this is not limitative. The invention can be applied in any electronic device including two foldable housings and incorporating two antennas. For example, the invention can be applied in PDA (personal digital assistants), laptop computers, mobile game devices, and the like.

Further, in the invention, since the electric wiring section and the inductive coupler are arranged at a distance from each other, it is possible to reduce cancellation of antenna current of the first antenna between the electric wiring section and the inductive coupler.

Further, in the invention, since the connection section between the reference potential section of the first circuit board and the inductive coupler is formed so as to have inductance, the inductive coupler has higher inductance than the reference potential section of the first circuit board, whereby it is possible to prevent deterioration in the gain of the second antenna.

That is, in the invention, since the connection section between the reference potential section of the first circuit board and the inductive coupler is formed so as to have inductance, the inductive coupler has a weaker ground at high frequency than the reference potential section of the first circuit board, enabling the inductive coupler to function as an inductor for increasing the gain of the second antenna.

Further, in the invention, the inductive coupler is arranged so as not to overlap with the second antenna when the first circuit board is seen in plan view, deterioration in the gain of the second antenna can be reduced.

Further, in the invention since the connection section is integrally molded with the supporting member, or pasted to it, it is possible to prevent contact failure caused by scratching away of a conductive coating, or a coating such as vapor deposit and it is possible to reduce the number of components.

The invention claimed is:

1. A mobile wireless device in which a first housing and a second housing are connected together at base ends thereof via a hinge section, the first housing including a first circuit board to which a first antenna and a second antenna are connected, and the second housing including a second circuit board, the mobile wireless device comprising:
   an electric wiring section that brings a reference potential section of the first circuit board and a reference potential section of the second circuit board into conduction; and
   an inductive coupler that inductively couples the reference potential section of the first circuit board and the reference potential section of the second circuit board at high frequency near the second antenna provided at the base end of the first housing, the inductive coupler including a first conductor that extends toward the second housing side at the base end of the first housing and connects to the reference potential section of the first circuit board.

2. The mobile wireless device according to claim 1, wherein the electric wiring section and the inductive coupler are arranged at a distance from each other.

3. The mobile wireless device according to claim 1, wherein the inductive coupler includes a second conductor extending toward the first housing side at the base end of the second housing, being arranged near the first conductor, and connecting to the reference potential section of the second circuit board.

4. The mobile wireless device according to claim 3, wherein the second conductor has a sheet-like shape.

5. The mobile wireless device according to claim 1, wherein at least one part of the inductive coupler is formed at a supporting member which supports the hinge section.

6. The mobile wireless device according to claim 1, wherein a connection section between the reference potential section of the first circuit board and the inductive coupler is formed so as to have inductance.

7. The mobile wireless device according to claim 6, wherein the connection section is constituted from a spring member.

8. The mobile wireless device according to claim 7, wherein the spring member makes point-contact between the reference potential section of the first circuit board and the first conductor.

9. The mobile wireless device according to claim 1, wherein the inductive coupler is arranged so as not to overlap with the second antenna when the first circuit board is seen in plain view.

10. The mobile wireless device according to claim 1, wherein the first conductor includes a leaf spring section.

11. The mobile wireless device according to claim 1, further comprising:
a supporting member that is provided at the base end of the first housing, and supports the hinge section,
wherein the first conductor includes a conductive material covering a surface of the supporting member.

* * * * *